United States Patent [19]
Allen et al.

[11] Patent Number: 5,386,221
[45] Date of Patent: Jan. 31, 1995

[54] LASER PATTERN GENERATION APPARATUS

[75] Inventors: Paul C. Allen; Matthew J. Jolley, both of Beaverton; Robin L. Teitzel; Michael Rieger, both of Portland; Michael Bohan; Timothy Thomas, both of Beaverton, all of Oreg.

[73] Assignee: Etec Systems, Inc., Beaverton, Oreg.

[21] Appl. No.: 970,480

[22] Filed: Nov. 2, 1992

[51] Int. Cl.[6] .............................................. B41J 2/435
[52] U.S. Cl. .................................................... 346/108
[58] Field of Search ..................... 346/1.1, 108, 107 R, 346/76 L, 160; 358/296, 300, 302

[56] References Cited

U.S. PATENT DOCUMENTS

| | | |
|---|---|---|
| Re. 33,931 | 5/1992 | Witney .................................. 355/53 |
| 4,639,073 | 1/1987 | Yip et al. .............................. 358/296 |
| 4,778,233 | 10/1988 | Christenson et al. . |
| 4,796,038 | 1/1989 | Allen et al. . |
| 4,797,696 | 1/1989 | Allen et al. . |
| 4,956,650 | 9/1990 | Allen et al. . |

OTHER PUBLICATIONS

Michael L. Rieger, James A. Schoeffel, Paul A. Warkentin, 1988 SPIE Santa Clara Symposium Conference 922-Optical Microlithography VII, Image Quality Enhancements for Raster Scan Lithography, 10 pages.

*Primary Examiner*—Mark J. Reinhart
*Attorney, Agent, or Firm*—Blakely, Sokoloff, Taylor & Zafman

[57] ABSTRACT

An improved laser pattern generation apparatus. The improved pattern generation apparatus of the present invention uses a laser beam to expose a radiant sensitive film on the workpiece to print circuit patterns on a substrate. The laser beam is aligned using a beam steering means. The laser beam is split into 32 beams to create a brush. The brush scans the workpiece through use of a rotating polygonal mirror. Each beam of the brush may have one of seventeen intensity values. The beams are modulated by an Acousto-Optical Modulator. Signals provided to the Acousto-Optical Modulator define the pattern to be generated. These signals are created by a rasterizer. Increased print speed is accomplished through the use of a wider brush and a print strategy that eliminates physical stage passes.

28 Claims, 12 Drawing Sheets

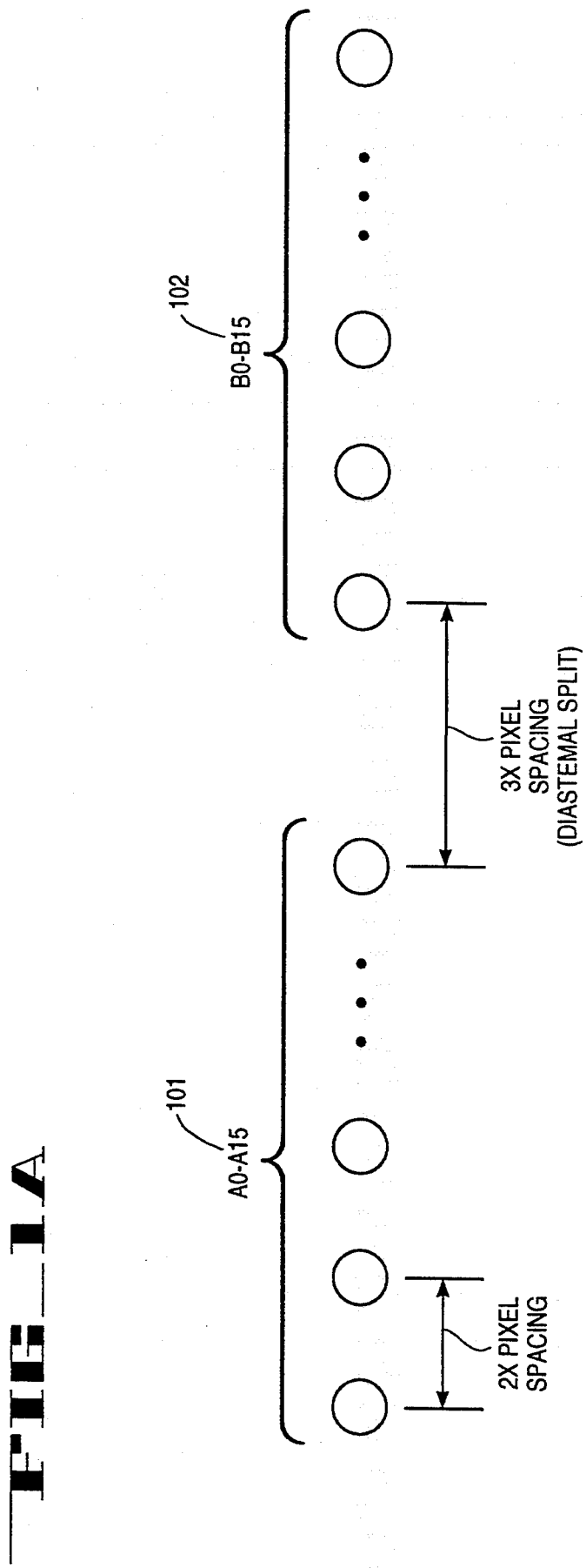

FIG_1B
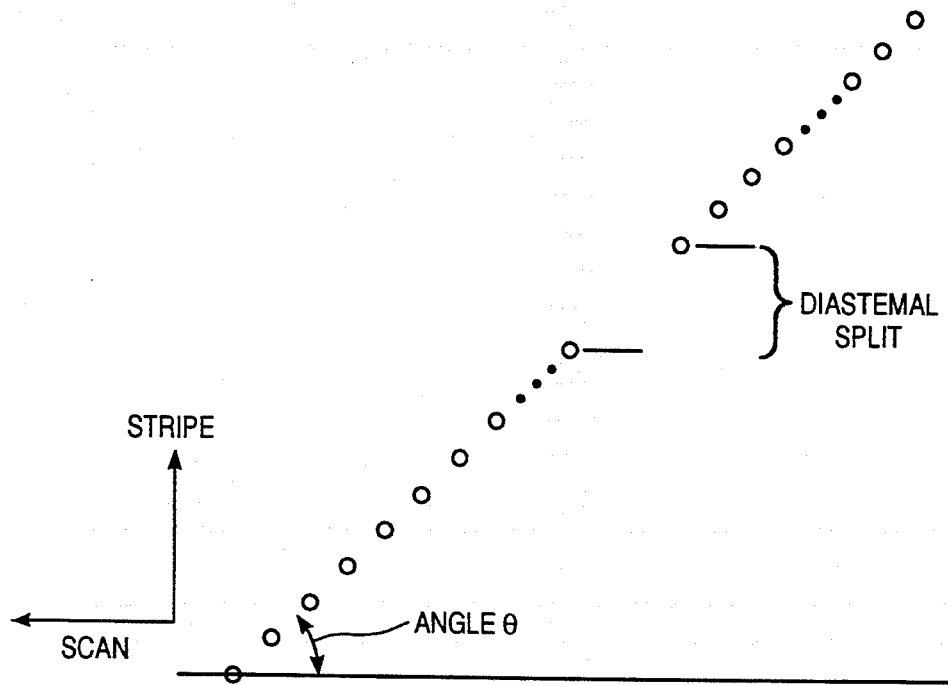
FIG_1C
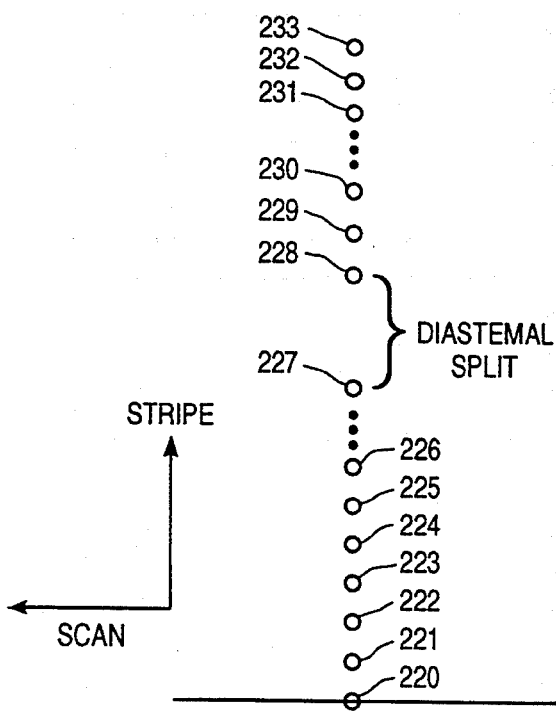

FIG_1D
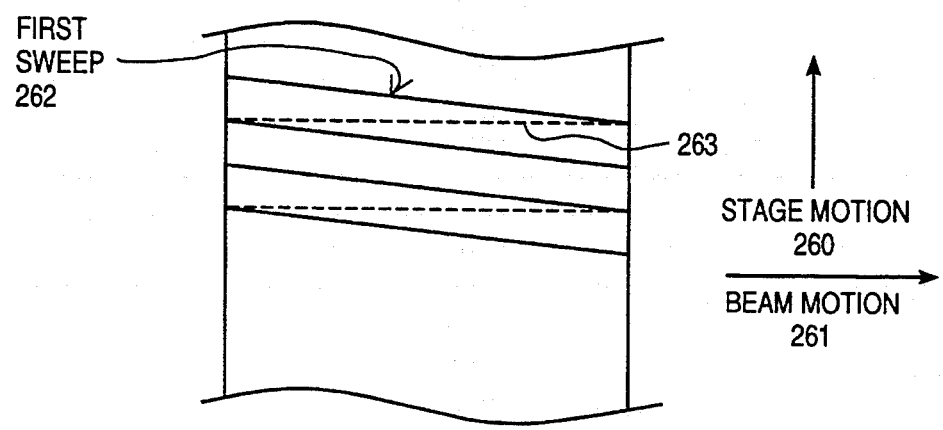
FIG_1E
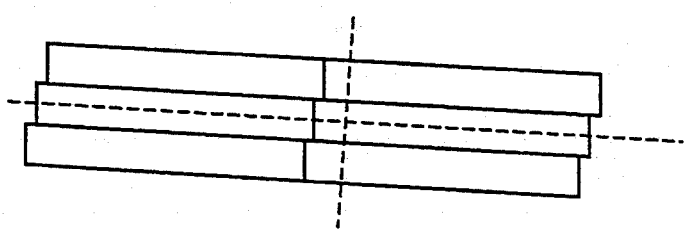
FIG_1F
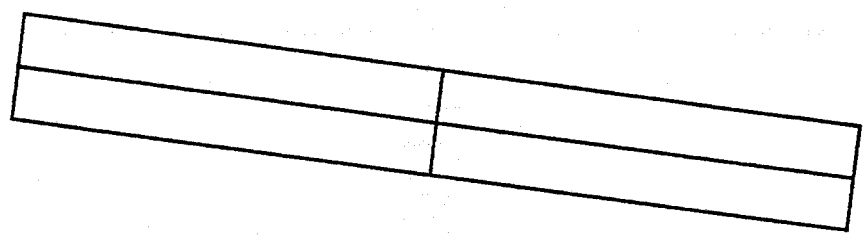

FIG_2

FIG_3A
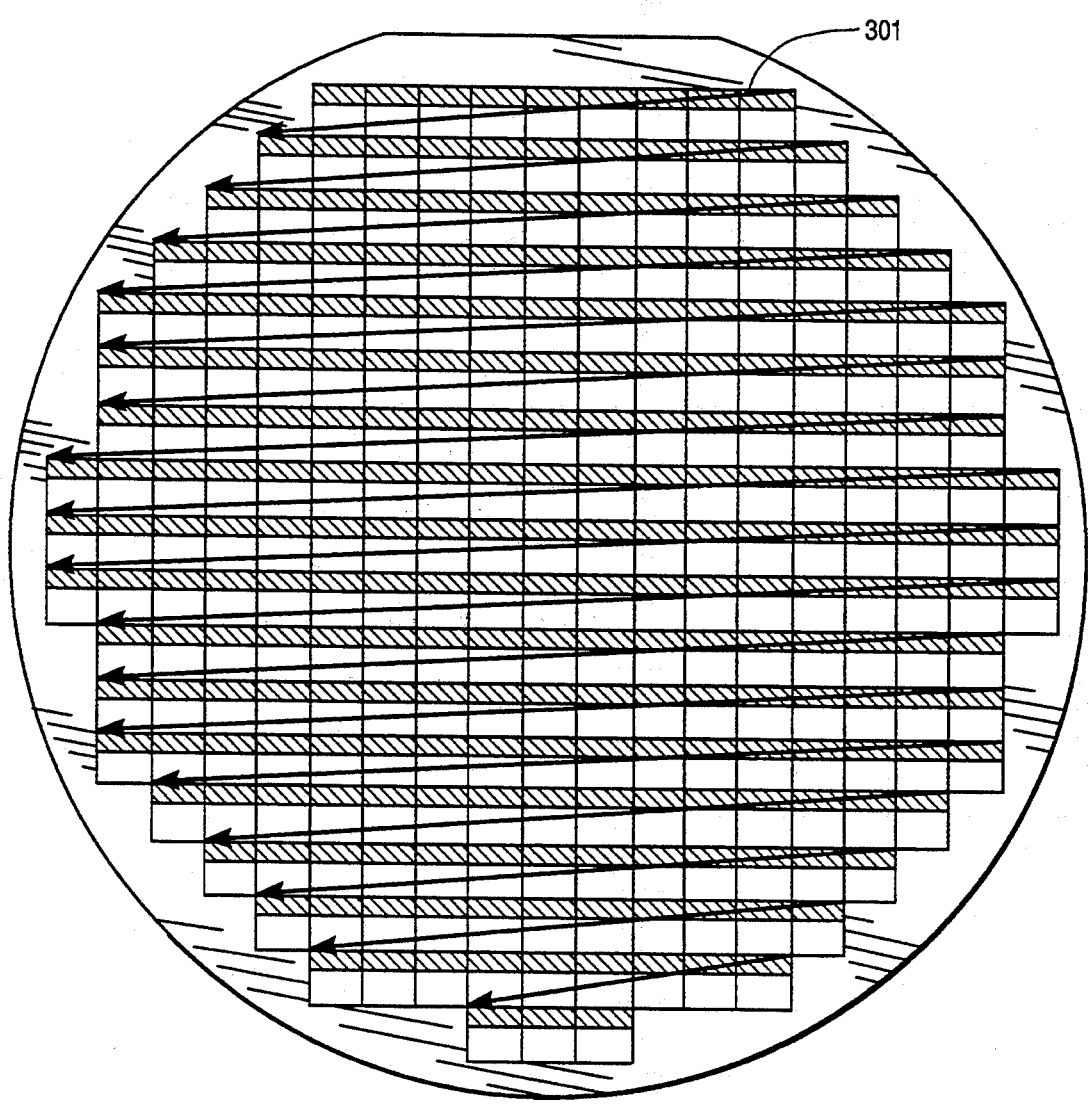

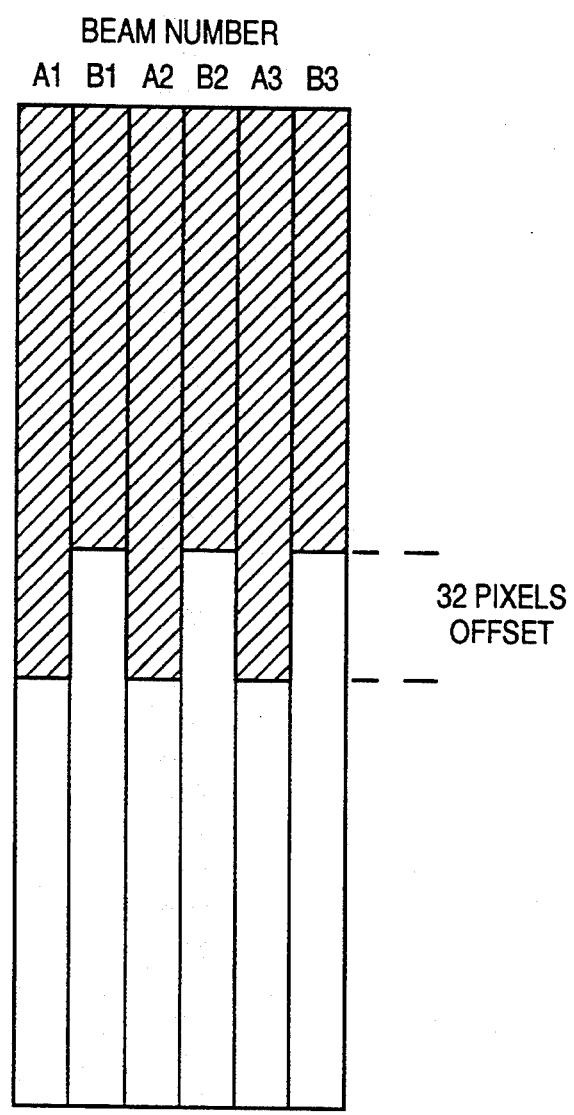
FIG_3B

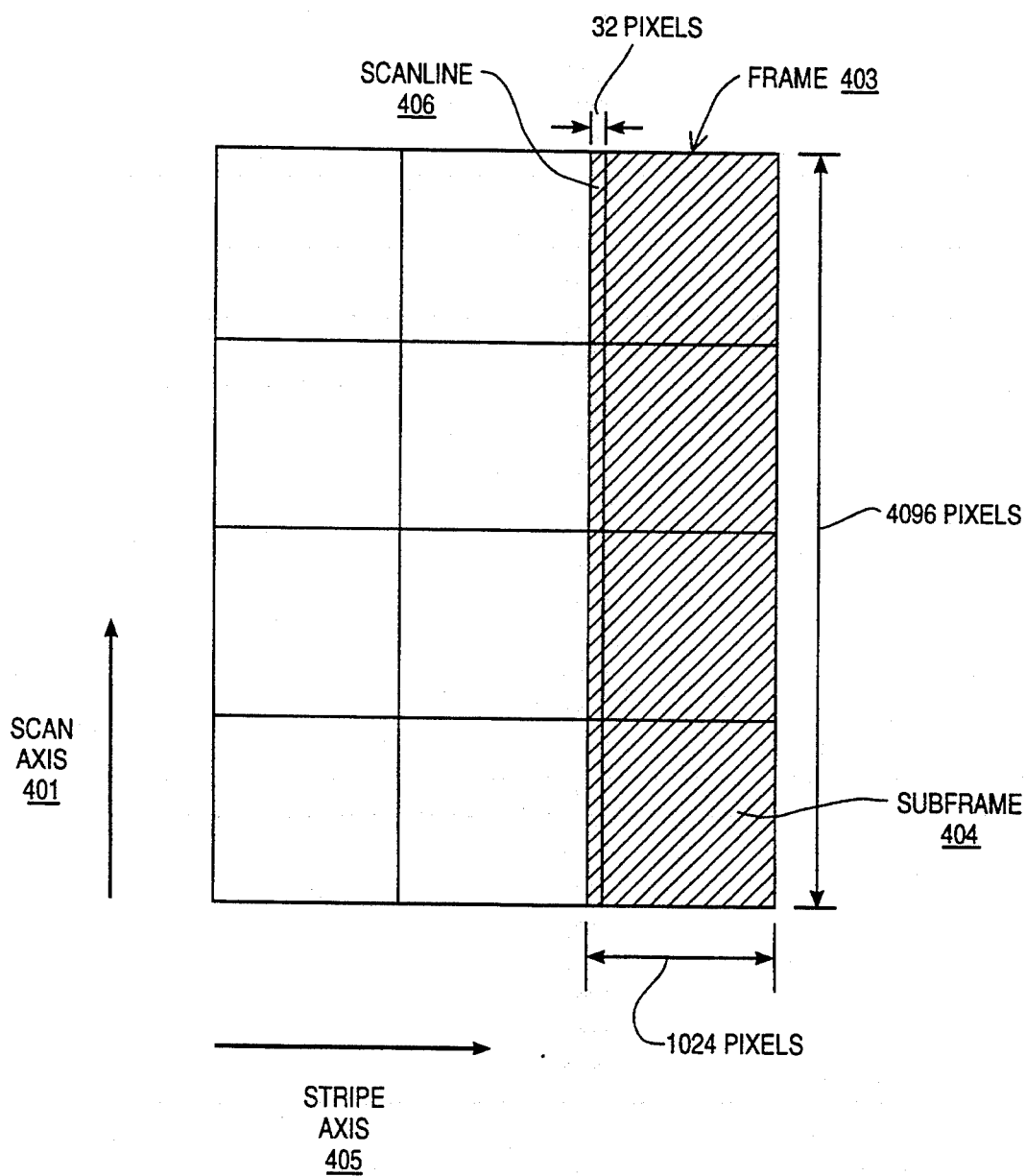
FIG_4

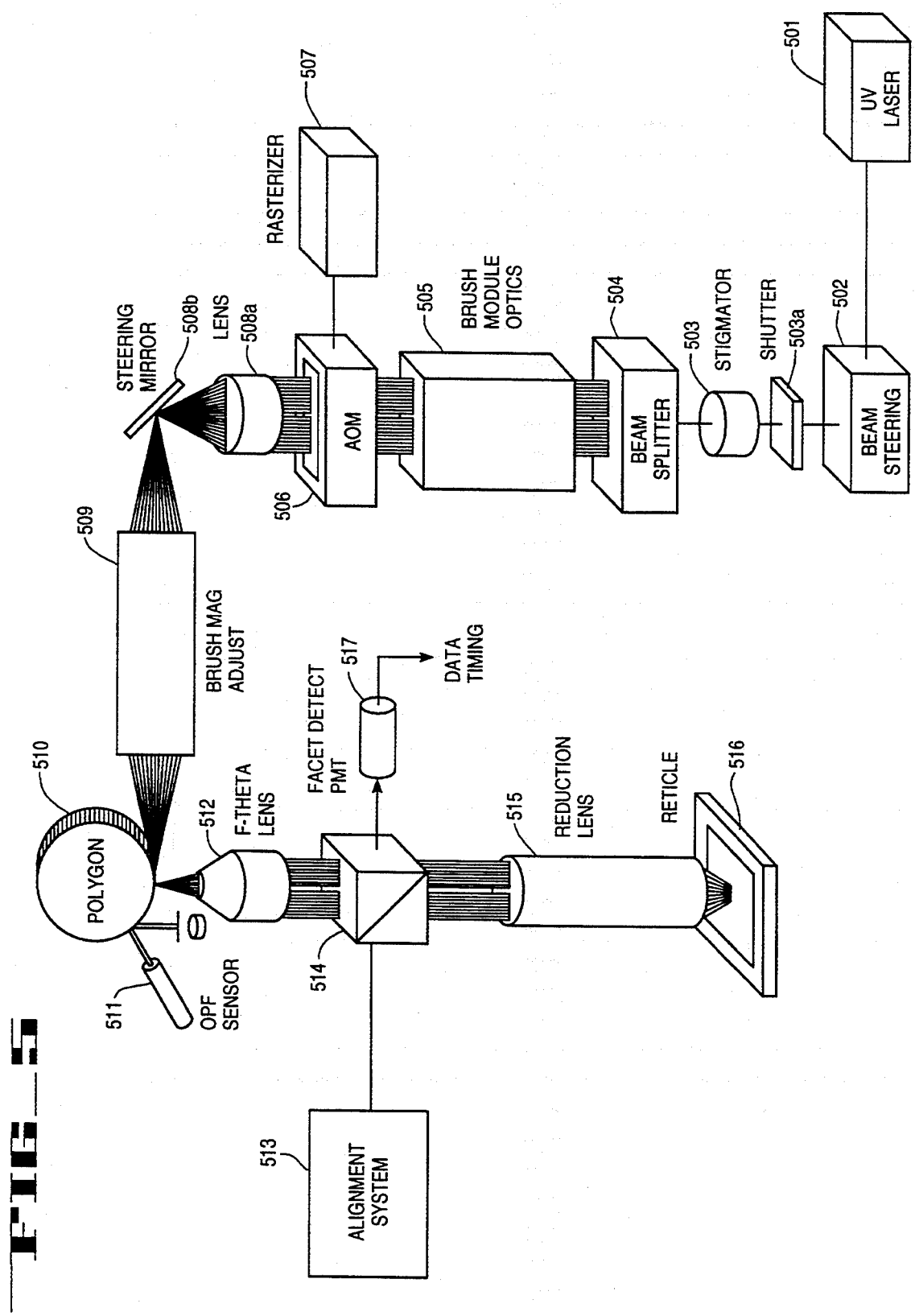
FIG_5

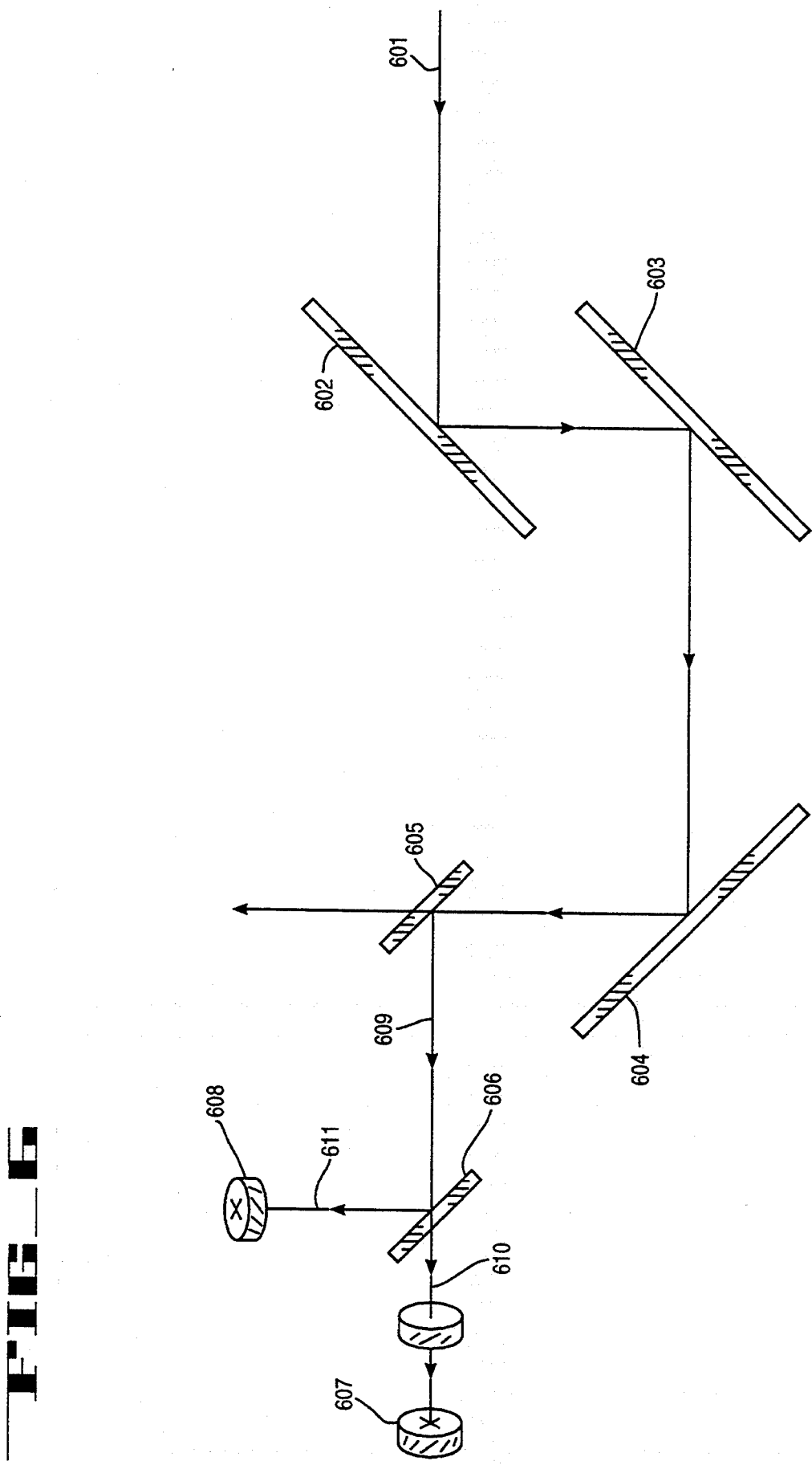

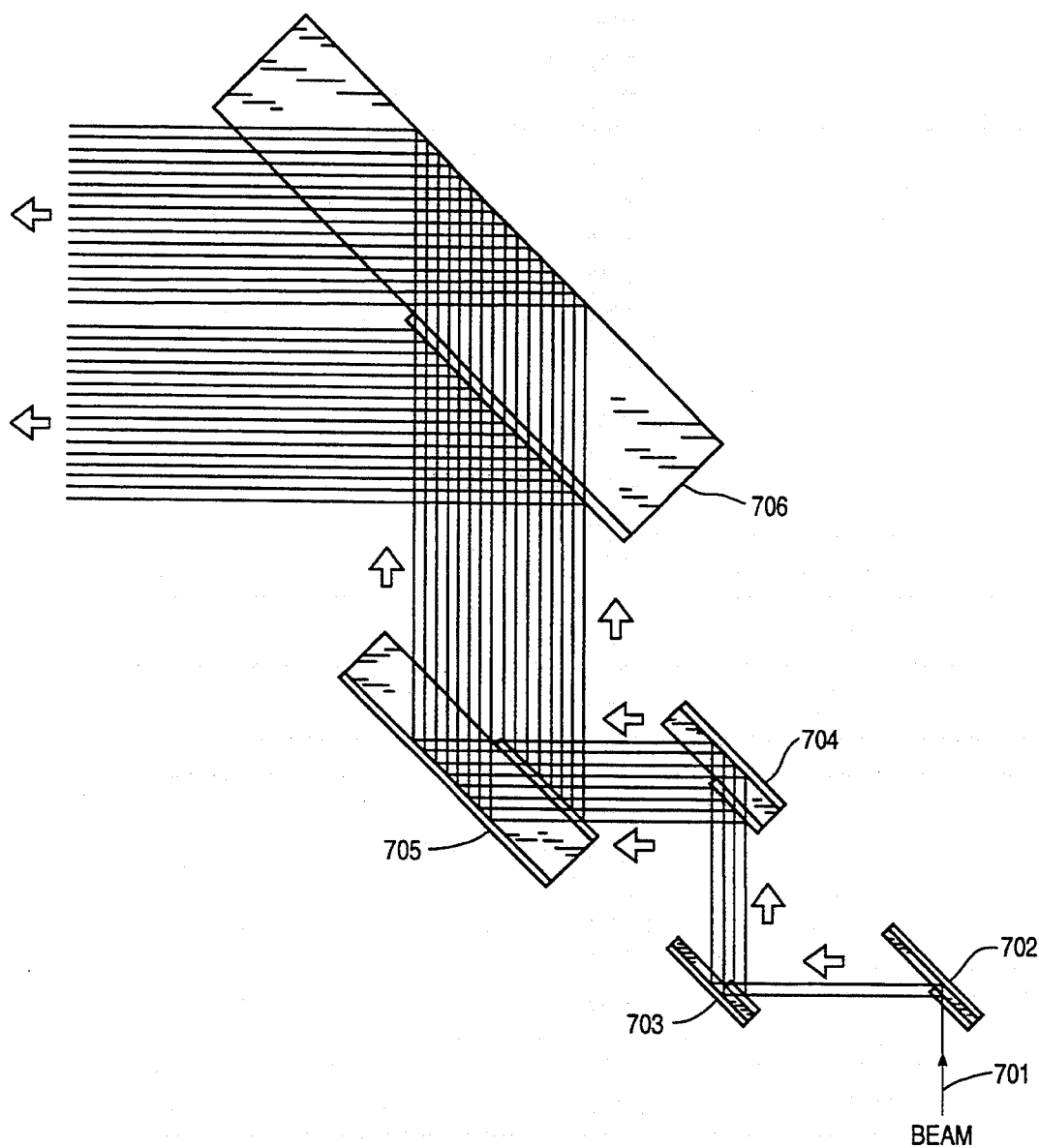
FIG_7
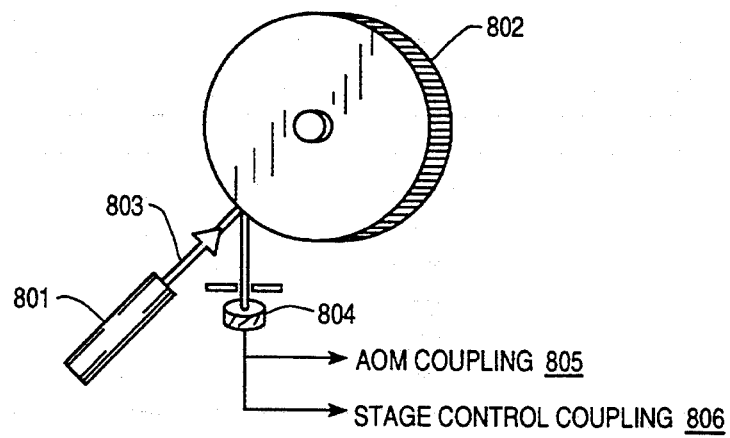
FIG_8

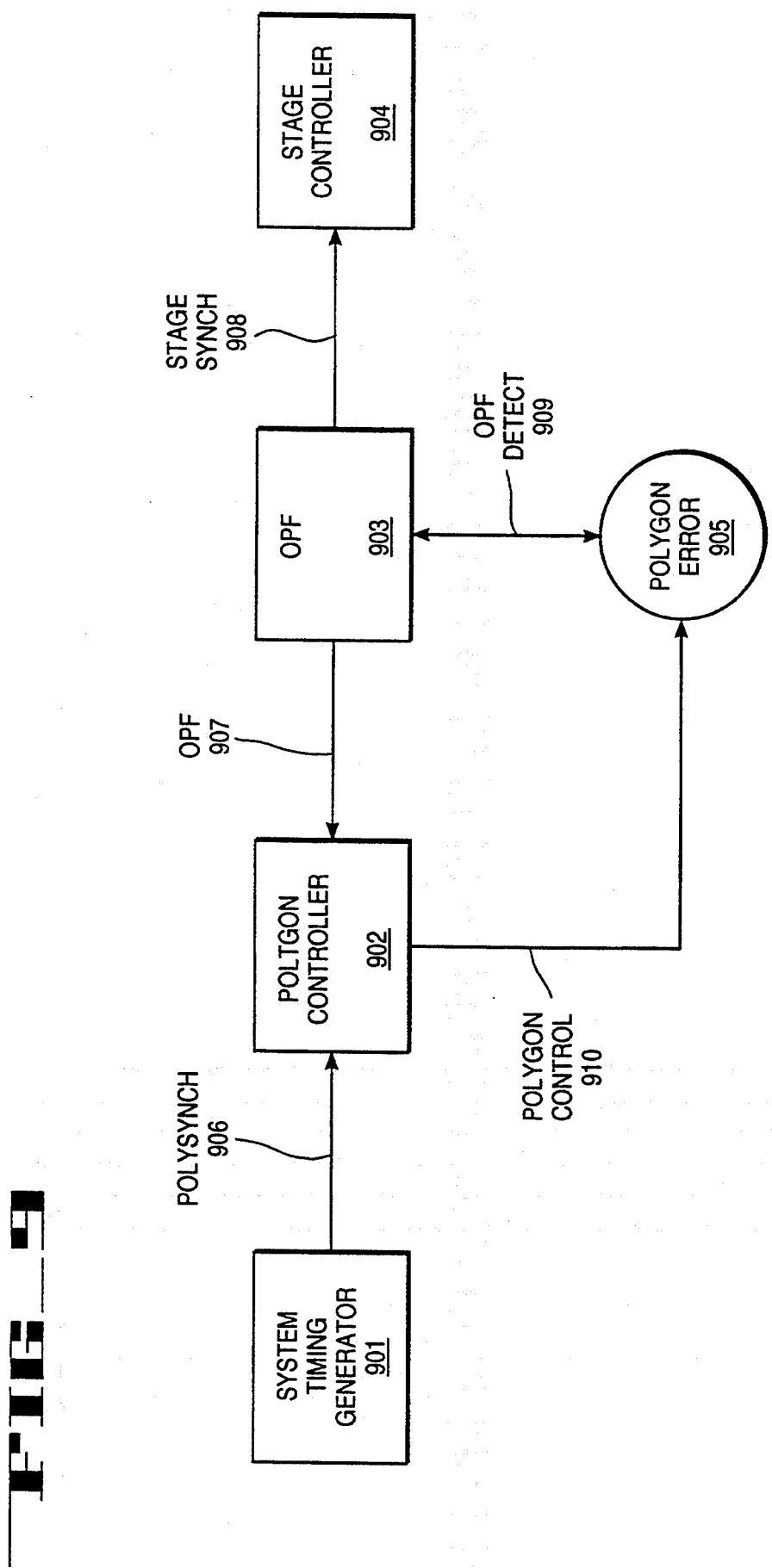

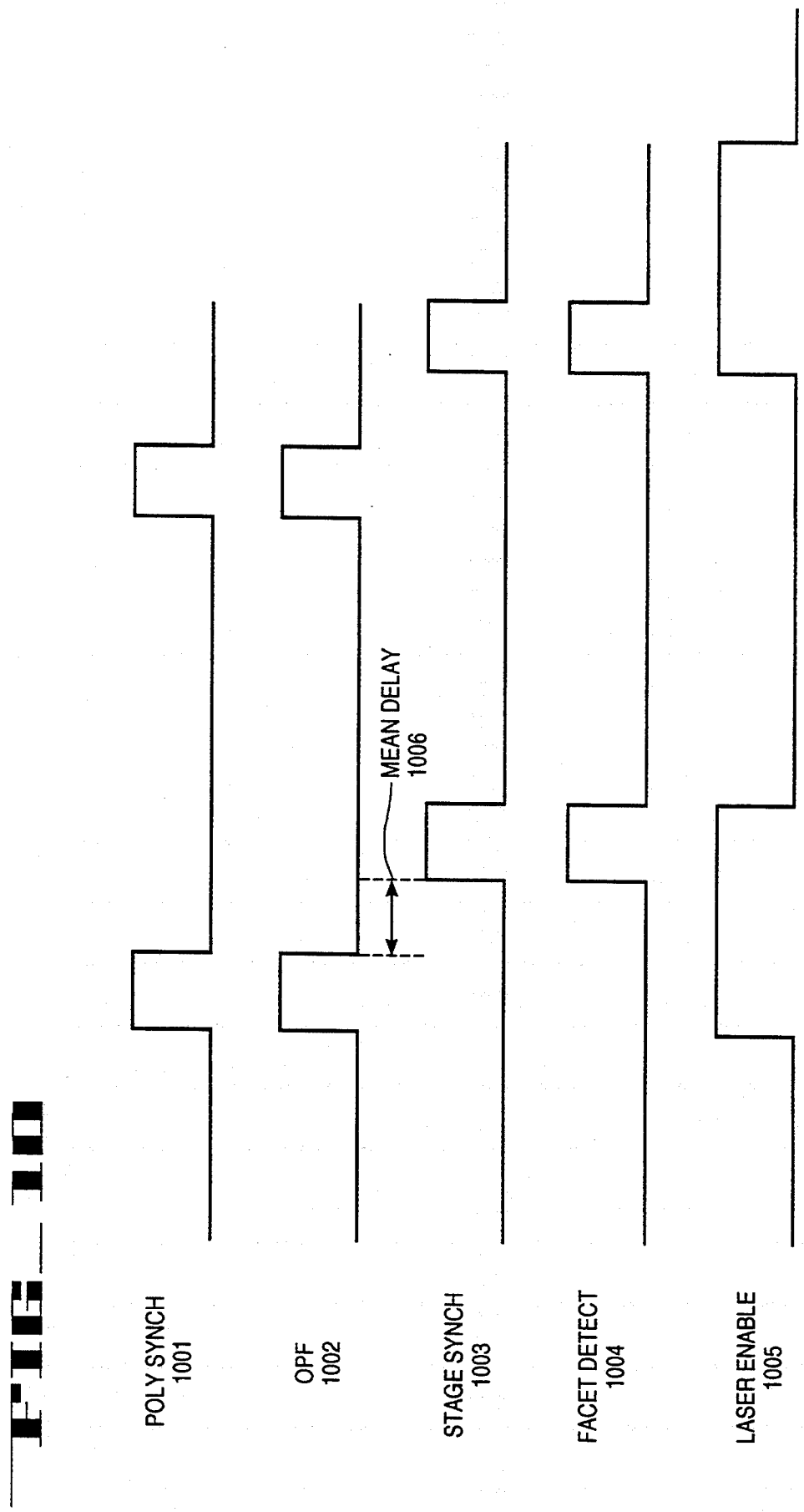

LASER PATTERN GENERATION APPARATUS

BACKGROUND OF THE INVENTION

1. Field of the Invention

This invention relates to the field of pattern generation using a laser and radiant sensitive film, in particular for the fabrication of integrated circuits.

2. Prior Art

In the photolithographic fabrication of integrated circuits, film sensitive to radiant particle energy is exposed in predetermined patterns to define circuit features. In some cases, the energy is passed through masks which contains the patterns, thereby selectively exposing a photoresist film on a semiconductor body. In other instances, the film is on a mask substrate and the film is exposed as a step in the making of the mask. Other times the direction of the radiant energy itself is controlled to define patterns in the film. This can be done as part of the making a mask (or reticle) or to directly "write" onto the resist film covering a semiconductor wafer. Several sources of radiant energy have been used, including ultraviolet light, visible light, coherent light, x-rays and electron beam (E-Beam).

A system for photolithographic fabrication of integrated circuits is described in U.S. Pat. No. 4,796,038 entitled "Laser Pattern Generation Apparatus" which is assigned to the assignee of the present application. In U.S. Pat. No. 4,796,038 circuit patterns are written onto a workpiece by directing laser beams and moving a workpiece relative to the laser beams. A single laser beam is split into eight (8) beams to form a brush. The beams pass through a multi-channel Acousto-Optical Modulator (AOM). The AOM receives electric signals defining the circuit patterns. The AOM is used to control the intensity of the beams as they write onto the workpiece. A steering mirror is used for directing the plurality of beams through a zoom lens arrangement and towards a rotating polygonal mirror. The steering mirror is used to adjust and align the beams in response to movement of the workpiece. The zoom lens arrangement is for adjusting the size and placement of the beams. The rotating polygonal mirror has a plurality of facets and is used to scan the beams onto the workpiece in a raster-like scan. Through successive scans of the brush, a stripe is printed on the workpiece. The stripes comprise the different portions of the integrated circuit pattern.

Commercially available systems embodying the laser pattern generation apparatus of U.S. Pat. No. 4,796,038 include the CORE 2100, 2500, 2564 and WAFER WRITE-6000 Systems available from Etec Systems, Inc. of Beaverton, Oreg.

Although the laser pattern generation apparatus of U.S. Pat. No. 4,796,038 and the commercially available embodiments provide satisfactory results, increased printing speed is always desirable. Thus, it is a primary object of the present invention to increase printing speed. Furthermore, this increase in speed can be used to reduce pattern errors through further use of multipass averaging.

Known laser based pattern generation apparatus of this type have other limitations. One such limitation concerns laser alignment. Laser alignment is critical. Variations in laser alignment introduces various errors in the printing process, resulting in incorrectly generated patterns. The direction and resulting alignment of a laser beam is affected by the temperature of the laser. Typically, the laser is water cooled. Thus, variations in the water temperature may have an effect on the alignment of the laser beam. Such systems have water temperature control sensors which monitor and maintain control of the water temperature to within a narrow range, (e.g. 0.1° Celsius). Such temperature control systems add complexity to the pattern generation apparatus. It would be desirable to have an apparatus where water control temperature need not be so precisely maintained.

Further, adjusting laser beam alignment is a manual process that requires significant down-time of the apparatus. It would be desirable to provide an apparatus wherein laser beam alignment may be corrected so as to minimize the amount of required down-time.

Other improvements over the prior art systems will become apparent in the description of the present invention.

SUMMARY

An improved apparatus for generating a pattern on a workpiece having a film responsive to radiant energy, is disclosed. A laser is used for the source of a radiant energy beam. Alignment of the beam is accomplished through the use of a beam steering means. The beam is then split into two groups of beams, separated by a predetermined gap (a diastemal split). The beams are then passed through a multi-channel Acoustic-Optical Modulator (AOM). The AOM receives signals defining the pattern. These signals provide for multiple shades of gray to be printed. A steering mirror directs the beams to a rotating polygonal mirror and for adjusting the beams in response to movement of the workpiece. The rotating polygonal mirror has a plurality of facets to direct the beams towards the workpiece in a sweeping fashion, thus causing the printing of the pattern in a raster-like scan.

The present invention provides for increased writing performance. A first source of increased performance is the use of a wider brush, i.e. a greater number of beams. This increases the area printed with a single sweep of the polygon. Second, generation of gray scale levels provides for fine edge placement resolution, thus minimizing the number of stage passes needed. Finally, retracing for error averaging is reduced. This is accomplished by averaging with 2 adjacent polygon facets.

The enhancements are implemented in a printing strategy. The printing strategy of the present invention calls for printing of the pattern according to a pixel grid that is composed of two regular, square arrays of pixels offset from each other by one half a unit distance in the stripe and scan axes. One of the square array of pixels is referred to as a normal grid. The other square array of pixels is referred to as the interstitial grid. This unit of separation is a pixel. The pattern is written by a brush composed of two groups of beams. The two groups of beams are separated by three pixels in the stripe direction. Each beam within a group is separated by two pixels in the stripe direction. Each pixel has a gray scale value. A plurality of scans are printed to comprise a stripe. Each scan is offset from the previous scan so as to fill in the gaps caused by the spacing between the beams. Each stripe for each row of die is printed in order to minimize computational requirements. The stripes are printed to complete rows of die until the entire mask is printed.

Other improvements inherent in the present invention will be apparent from the detailed description.

BRIEF DESCRIPTION OF THE FIGURES

FIG. 1a illustrates the beam organization at a final image plane as utilized by the currently preferred embodiment of the present invention after the introduction of time delay.

FIG. 1b illustrates the beam organization before a time delay being introduced.

FIG. 1c illustrates the beam organization after a beam time delay being introduced as provided in the currently preferred embodiment of the present invention.

FIG. 1d illustrates the angle of printing resulting from the stage and beam motion of the currently preferred embodiment of the present invention.

FIG. 1e illustrates a misaligned printing image resulting from rotation of the pattern to be generated.

FIG. 1f illustrates the corrected printing image after the introduction of a pixel time delay as may be utilized in the currently preferred embodiment of the present invention.

FIG. 2 illustrates a writing grid as utilized by the currently preferred embodiment of the present invention.

FIG. 3a illustrates the printing strategy on a mask as utilized by the currently preferred embodiment of the present invention.

FIG. 3b illustrates the dovetail feature of the printing strategy as performed by the currently preferred embodiment of the present invention.

FIG. 4 illustrates the geometric coordinates and frame as utilized by the currently preferred embodiment of the present invention.

FIG. 5 is a block diagram of the pattern generation apparatus of the present invention.

FIG. 6 is a block diagram illustration of a beam steering means as may be utilized by the currently preferred embodiment of the present invention.

FIG. 7 is a block diagram illustration of a beam splitter as may be utilized by the currently preferred embodiment of the present invention.

FIG. 8 is a block diagram illustration of a Once Per Facet (OPF) Detector as may be utilized by the currently preferred embodiment of the present invention.

FIG. 9 illustrates the couplings of the OPF Detector and a system timing generator as utilized by the currently preferred embodiment of the present invention.

FIG. 10 is a timing diagram of the major synchronization signals used for operation of the currently preferred embodiment of the present invention.

DETAILED DESCRIPTION OF THE PREFERRED EMBODIMENT

A laser pattern generating apparatus is described which is particularly suitable for selectively exposing photosensitive layers such as photoresist layers used in the fabrication of integrated circuits. In the following description, numerous specific details are set forth such as pixel sizes, laser specifications, etc., in order to provide a thorough understanding of the present invention. It would be apparent, however, to one skilled in the art that the present invention may be practiced without such specific details. In other instances, well known structures, such as lens assemblies, etc., are not set forth in detail in order to not unnecessarily obscure the present invention.

The present invention is disclosed in disclosure document number 309782 filed pursuant to the document disclosure program of the United States Patent and Trademark Office.

The present invention provides performance and maintainability improvements over the prior art. The performance improvements result in increased printing speeds. Known laser pattern generators for printing integrated circuit patterns have print speeds up to 2 masks per hour. The currently preferred embodiment of the present invention has a theoretical maximum print speed of up to 5 masks per hour while maintaining the error thresholds of the prior art systems. The present invention may also be used to print circuit patterns on wafers.

In the currently preferred embodiment of the present invention increased print speed is accomplished in three ways. First, the width of the brush used to create a scanline is increased. This is done by increasing the number of beams comprising the brush. Thus, fewer passes are need to print the same area. Second, edge placement resolution is increased by creating different gray scale levels for a pixel. In previous systems, gray scale levels were primarily done through multiple passes. Third, more error averaging is accomplished within one physical stage pass. These techniques are embodied in a new printing strategy.

Prior to describing the print generation apparatus, it is instructive to describe the beam organization, the print strategy and error averaging techniques employed.

Beam Organization

As noted above the initial laser beam is split into 32 beams which are modulated to create the image on the workpiece. FIG. 1a illustrates the effective beam organization at the final image plane after timing delays are introduced. Referring to FIG. 1a, the beams are organized into two groups of 16 beams, 101 and 102 respectively. Each of the beams within a group is separated by a fixed predetermined distance in the stripe axis, namely a 2X pixel spacing (0.533 micrometers). In the currently preferred embodiment beam diameter is approximately 0.4 microns. To properly modulate the beams, the beams must be separated by more than one or two microns and yet print as if they are separated by 0.533 micrometers. In the currently preferred embodiment a pixel unit is 0.2666 micrometers or (25*32/3 nanometers in width). Between the two groups a 3X pixel spacing in the stripe axis is included (0.8 micrometers). This spacing in the stripe axis between the two sections is referred to as a diastemal split. The diastemal split plays a role in generating the proper error averaging during the successive passes in the printing processes.

As the workpiece moves in a direction perpendicular to the brush, to achieve the desired pattern, the data provided to each of the beams in the brush is delayed by n clocks, (or pixel period). In the currently preferred embodiment n is equal to six (6). This delays the data until the beam is in the correct position. The delay corresponds to the distance between the beams in the scan direction. The effective brush is a straight line.

FIG. 1b illustrates beam organization before introduction of a time delay. Referring to FIG. 1b, without a time delay, the beams comprising the brush are printed at the angel θ (theta) 110. Note that the spacings between the pixels 111 and the diastemal split are with respect to the stripe axis.

Referring now to FIG. 2c, the printing of the beams after the delay is illustrated. Assuming beam 120 is printed first and the stage is moving from left to right, the remainder of the beams 121-133 are timed so the resulting printed usage is straight.

Angle of Printing

As the printing process occurs, the stage motion and the beam motion create an angled line with respect to the stage motion. This is illustrated in FIG. 1d. From FIG. 1d it is shown that the stage motion 160 is perpendicular to beam motion 261. A first sweep 262 creates an angled line with respect to a beam motion axis 263. The angle is the arctan (32/4096) or the arctan (1/128) which is 7.812 mRadians. Note that the angle of printing limits the printing to one direction. Otherwise a "herringbone" pattern would result.

The whole pattern is printed with this angle. The starting positions of the adjacent passes are offset so that the first sweeps all align without a zig-zag. Next, the whole printed image is rotated by this angle. In this way, the whole pattern is rotated. The object is to print on an angle. To accomplish this the axis of stage motion is set at a slight angle to the axis of polygon spin. The delays introduced to set theta to 18.434 degrees result in a brush that is exactly aligned to the polygon axis. Thus the scan footprint appears as a parallelogram as indicated in FIG. 1e. This is the method used in the laser pattern generation apparatus described U.S. Pat. No. 4,796,038.

The error in alignment of the ends of the parallelograms is ½ of a pixel for the wider brush of a 32 beam system. This is large compared to an acceptable error budget. To compensate, every pixel is delayed by a slight amount to create an angled brush, so that the printed area is a rectangle instead of a parallelogram. With a print clock period of 20 ns, the maximum delay is approximately 20 ns *½ or 10 nS. The increment of delay between beams is 0.312 nanoseconds. Note that this is a second delay added in addition to the beam delay discussed above with respect to beam organization. The final result would be as illustrated in FIG. 1f.

Print Strategy and Error Averaging

It has been determined that by making the pixel address grid small enough, any grid snap errors that would occur would be negligible (this also has the effect of eliminating the need for a Zoom Lens Assembly). The desired address grid is a multiple of 25 nM. The address grid chosen is 25 nM/3 or 8.3333 nM. Each pixel unit represents 32 address grid units. To accomplish this, beam intensity variation (gray scaling) for edge placement is utilized. In prior systems, gray scales were primarily achieved through successive physical stage passes over the workpiece. At most one intermediate gray scale value was introduced directly by beam intensity.

In the currently preferred embodiment of the present invention, gray scales are achieved through 17 levels of intensity variation of the beams in the brush and optionally through successive physical stage passes. The intensity values are generated by a rasterizer that is coupled to the pattern generation apparatus.

To increase the resolution and to improve the averaging, one pass is done according to a normal grid and one pass is done according to an interstitial grid. During each pass the two groups of 16 beams interleave each other. The interstitial grid is offset from the normal grid by half a pixel in both the stripe and scan axes. Effectively, four passes are done as two physical stage passes. For each group of beams and each pass the data is written on a different polygon facet. However, instead of printing the same data four times, the data during the four passes print different pixels. Since the beam diameter is larger than the pixel spacing, the averaging is still accomplished amongst neighboring pixels. This averaging technique forces every other pixel to be printed on a different facet of a rotating mirror.

A pixel grid as utilized in the currently preferred embodiment is illustrated in FIG. 2. Referring to FIG. 2, pixels labeled A and B are printed on one stage pass and pixels labeled C and D are printed on one stage pass. The pixels labeled A and B are printed on a normal grid, whereas the pixels labeled C and D are printed on the interstitial grid.

Generally, the printing system will print flames along the scan axis across the reticle as the workpiece moves along the stripe axis. A frame is a printing unit that is described in more detail below. By analogy, visualize a brush stroke going up and down across a horizontally moving surface to create a stripe. When a stripe is completed, the next stripe to be printed strategy is at the location on the reticle is just below the completed stripe. This strategy is acceptable for printing reticles, with data which is different stripe to stripe.

For printing masks or wafers which contain multiple die with the same data, a different strategy is employed. FIG. 3a illustrates the general print strategy for printing an array of integrated circuits on a reticle or wafer. Referring to FIG. 3a, stripes are printed across the surface of the substrate along a stripe axis. It should be noted that reticles and wafers are comprised of a plurality of die. Each die on the reticle or wafer will have the same circuit pattern. Thus, in order to avoid the recalculation and reloading of data for each row of die, each identical stripe for each row of die is printed at one time. This is illustrated in FIG. 3 where a stripe 301 for each of the various row of die on the substrate is printed. As mentioned above, each stripe is printed by the printing of frames along a scan axis. This will become more apparent with respect to FIG. 4.

FIG. 3b illustrates another aspect of the print strategy called dovetailing. When two passes are printed next to each other there are small errors in the relative placement of the ends of the scan lines known as butting errors. Dovetailing is a technique whereby the scan lines formed by the individual beams are alternately offset in the scan direction. This effectively averages the errors in the butt joint over the distance of the offset.

Referring to FIG. 3b, a portion of the beam brush is illustrated. During a first pass, beams A1, A2 and A3 are offset from the beams B1, B2 and B3. During a pass m that a butts pass n, the beams retain the same offset. Thus it can be seen that the resulting printing from the beams is interleaved.

Butt joint errors are further reduced by printing the interstitial grid at a scan offset with respect to the normal grid. In this way a region with butt joints is averaged with a region without butt joints.

FIG. 4 illustrates the geometric coordinates and printing units as utilized in the currently preferred embodiment for the present invention. Referring to FIG. 4 a scan axis 401 and a stripe axis 405 are illustrated. As noted with reference to FIG. 3a, a stripe is printed across the substrate. For the purposes of generating accurate pixel data, a stripe is broken down into various subparts. A first unit is called a frame e.g. frame 403. The frame 403 is an area that is 1,024 pixels wide by 4,096 pixels tall. A pixel corresponds to what is printed by any of the plurality of beams. A pixel in the currently preferred embodiment is 0.26666 micrometers in width and will have 17 levels of gray. A frame is comprised of four sub frames, e.g. sub frame 404. A sub frame is 1,024 pixels wide by 1,024 pixels tall. Frame and sub frames are comprised of a plurality of scanlines e.g. scanline 405. A scan line is one sweep of a brush. A sweep of the brush occurs for the height of the frame. Since the brush is 32 pixels wide, a scan line is 32 by 4,096 pixels.

Overview of the Laser Pattern Generation Apparatus of the Currently Preferred Embodiment The pattern generation apparatus of the present invention uses a laser beam to expose a radiant sensitive film on the workpiece to print the circuit patterns. The laser beam is split into 32 beams to create a brush. The brush scans the workpiece through use of a rotating polygonal mirror. Each beam of the brush is modulated by the multi-channel Acousto-Optical Modulator (AOM). The electrical signals coupled to these channels determine the specific patterns to be generated. These electrical signals are created by a rasterizer. The rasterizer used for providing the electrical signals to the modulators is described in copending application entitled "Rasterizer for a Pattern Generation Apparatus", Ser. No. 07/970,293, filed on Nov. 2, 1992, which is assigned to the assignee of the present invention.

FIG. 5 illustrates in block diagram form the pattern generation apparatus of the currently preferred embodiment. Laser 501 provides a radiant energy beam source into the system. In the currently preferred embodiment a 1 Watt, Argon-ion laser operating at a wave length of 364 nanometers is utilized. Proper alignment of the radiant energy beam created by the laser 501 is performed by a beam steering means 502. The beam steering means 502 reduces the tolerances required for cooling the laser, and reduces the need to perform manual alignment of the source laser beam. Positioned after the beam steering means 502 is a shutter 503a. The shutter 503a provides a convenient means to prevent any of the radiant energy beam from reaching the workpiece. This is needed when the workpiece is to be repositioned and portions of the workpiece that should not be written on, enter the optical path of the beams.

The beam then passes through a stigmator lens assembly 503. The stigmator lens assembly 503 insures that the beam is circular by correcting for any elipticity and other astigmatic problems. A non-circular beam may introduce pattern generation errors. Such a stigmator lens assembly is described in U.S. Pat. No. 4,956,650 which is assigned to the assignee of the present application.

The corrected beam is then split into 32 individual beams by beam splitter 504. The plurality of beams is collectively referred to as the brush. The brush then passes through a brush module optics 505. The brush module optics 505 is a relay lens which is used to reimage and shrink the beams. The beams then enter the Acousto-Optical Modulator (AOM) 506. As noted above the AOM will be used to modulate the intensity of the laser beams to a level corresponding to one of the gray scale levels. The data needed to drive the AOM is provided by the rasterizer 507.

The brush then passes through a relay lens 508a which causes the beams to converge on a spot on a steering mirror 508b. The steering mirror 508b provides for small corrections to the placement of the brush in the stripe axis at the final image plane. The steering mirror alters the angle at which the brush impinges on the polygon mirror 510 in the stripe direction. A steering mirror that may be used in the currently preferred embodiment is described in U.S. Pat. No. 4,778,223 which is assigned to the assignee of the present application.

Prior to reaching the rotating polygonal mirror 510, the brush passes through a brush magnification adjustment lens assembly 509. The brush magnification adjustment lens assembly 509 is used to adjust the size of the array of beams. In particular, the beams can be made larger and moved farther apart, or they may be made smaller and moved closer together. The beams are then directed onto facets of the rotating polygon mirror 510. The rotating polygon mirror 510 has 24 facets and causes the brush to scan the workpiece along the scan axis. In the currently preferred embodiment, for a given pattern the rotating polygon mirror rotates at a constant rate of 20 krpm.

The beams reflected from the rotating polygon mirror then pass through an F-theta lens assembly 512. The F-theta lens assembly 512 creates an enlarged intermediate image plane (20× image plane). At the other end of the enlarged image plane, is a reduction lens 515. The beams exiting the reduction lens 515 are the beams that scan a workpiece 516.

A beam splitter 514 is disposed within the enlarged intermediate image plane. The beam splitter 514 provides beams to 2 subsystems; an alignment system 513 and facet detect Photo-Multiplier Tube (PMT) 517. The facet detect PMT 517 is used for timing of data for each of the facets of the rotating polygon mirror 510. This allows synchronization of the provision of information from the rasterizer 507 to the AOM 506 and the rotation of the rotating polygon mirror 510. The alignment system 513 is used to detect the position of patterns previously written on the substrate so that the pattern to be written can be accurately aligned to the previously written pattern.

Also illustrated in FIG. 5 is a Once Per Facet (OPF) sensor 511. The OPF sensor 511 is used for polygon synchronization and stage control. Prior systems used the facet detect PMT 517 to provide this information. However, this caused some difficulties because it required that the beam always be on. This created problems whenever the workpiece is repositioned and no writing occurs due to the finite leakage of the AOM in the off state.

Although not illustrated, the workpiece 516 having the photosensitive film is mounted on a stage assembly. Stage position is monitored by a plurality of inferometers and stage motion is performed by linear motors. During printing, the stage moves mostly along a stripe axis. The stage indexes to the next stripe by moving along a scan axis when writing is not occurring. Such stage assemblies are known in the art, thus no further description is deemed necessary.

Various aspects of the present invention will now be described in more detail.

Beam Steering Means

The beam steering means is used to ensure precise alignment of the laser beam before it is split into the plurality of beams. Such a beam steering means minimizes the need for complex laser cooling systems and minimizes the need to perform manual laser alignment.

FIG. 6 illustrates in greater detail, the beam steering means as utilized by the currently preferred embodiment of the present invention. Referring to FIG. 6 a radiant laser beam 601 is reflected off a first steering mirror 602. The steering mirror 602 provides for deflection of the beam in both stripe and scan axes. The beam is then reflected onto a stationary mirror 603 where it is directed to a second steering mirror 604. The second steering mirror 604 is also used to deflect the beam in both the stripe the beam and scan axes. In this manner the angle and position of can be controlled in both axes.

The beam 601 then enters a splitter 605 which splits off an alignment beam 609. The alignment beam 609 then enters a second splitter 606 which splits off an angle alignment beam 611 and a position alignment beam 610. The position alignment beam 610 passes through the imaging lens 612 and forms an image of the beam on the surface of mirror 604 on the quad photo cell detector 607. Thus detector 607 is sensitive only to beam 601 position at 604 and not to angular deflections at that surface. Steering mirror 602 is controlled by quad photo cell detector 607 and steering mirror 604 is controlled by quad photo cell detector 608. In this way both the position and angle of beam 601 is controlled.

The quad photo cell detectors 607 and 608 used in the currently preferred embodiment are well known in the art. Such quad photo detectors detect misalignment by detection of an alignment beam in two axes. If misalignment occurs a signal is sent which indicates the location where the alignment beam is detected.

The beam steering of the present invention provides for greater flexibility in the maintenance of the laser beam. As noted above, a laser beam may become misaligned as a result of temperature fluctuations. In prior systems such laser beams are water cooled. Precise control must be maintained in order for the water temperature to remain stable. The present invention allows a relaxation of the tolerances required in maintaining water temperatures. Further, alignment was typically manually controlled. In the present invention alignment maybe controlled via manual or automatic means.

Beam Splitter

The beam splitter 504 of FIG. 5 is further illustrated with respect to FIG. 7. The beam splitter as utilized by the present invention is similar to that as described in U.S. Pat. No. 4,797,696 which is assigned to the assignee of the present application. In any event, the beam splitter means of the currently preferred embodiment splits one beam into 32 different beams. Further a gap or diastemal between a first and second section of the 32 beams is introduced.

Referring to FIG. 7 a beam 701 enters a first splitter of thickness t which splits the beam into 2 beams. A splitter is comprised of a first surface which reflects 50% of the beam, a transparent material, and a second surface which reflects the remaining 50% of the beam. The distance between the two beams is determined by the distance between the first and second surfaces t (i.e. the thickness of the transparent material). In any event, the 2 beams are then reflected off a second splitter 303 of thickness 2 t. The second splitter 703 creates 4 beams. The 4 beams are then reflected off the splitter 704 of thickness 4t which creates 8 beams. These 8 beams are then reflected off splitter 705 of thickness 8t which creates 16 beams. Finally, the remaining 16 beams are reflected off of splitter 706 of thickness 16.5 t to create the desired 32 beams. Note that the splitter 706 is thicker than twice the thickness of splitter 705. This enables the creation of the diastemal split between the 2 sets of beams.

OPF Detector

The OPF Detector of the currently preferred embodiment is illustrated in more detail in FIG. 8. Referring to a FIG. 8, a laser source 801 within a focusing lens is directed towards a predetermined location with respect to the facets of a rotating polygonal mirror 802. As a beam 803 hits a facet of the mirror at a particular angle, it is reflected towards slit 807 and a detector 804. Slit 807 is placed at the focus of reflected beam 803. As the focused spot traverses the slit a sharp timing signal is generated from detector 804. Through the detection of reflections of the beam 803, the timing of rotation of the polygonal mirror 802 is determined. This information is then sent to the polygon control coupling 805 to synchronize the rotation of the polygon to the system timing generator. Concurrently, the timing information is sent to the stage controller via a stage control coupling 806 for synchronizing the movement of the stage along the stripe axis. As described above, timing of the data to the AOM is synchronized using the facet detect signal generated by PMT 517 in FIG. 5. In this way operation of the polygon and stage subsystems are independent of the main writing beam.

FIG. 9 illustrates the couplings of the OPF. As described with reference to FIG. 8, the OPF detects reflections of a laser beam off the rotating polygon mirror. This is illustrated here as OPF detect 909. OPF 903 is further coupled to stage controller 904 to provide a stage synch signal 908. OPF 903 is also coupled to polygon controller 902 to provide OPF signal 907. Polygon controller 902 provides polygon control signal 910 for synchronizing rotation of polygon mirror 905. A system timing Generator 901 further provides a POLY SYNCH signal 906. The synchronization is described with reference to FIG. 10 below.

FIG. 10 is a timing diagram illustrating the synchronization of the polygon and stage subsystems as well as the provision of data to the AOM. The stage and polygon receive timing information from the OPF detector. The system timing generator produces a stable clock signal called POLY SYNCH 1001. The polygon controller adjusts the speed and phase of the polygon so that the OPF signal 1002 is synchronized with the POLY SYNCH signal 1001.

When the beam 1 of the brush is turned on, the FACET DETECT signal 1004 is produced by the facet detect PMT. Data delivery to the AOM is timed from the FACET DETECT signal 1004 as increased accuracy is required for the fast motion (compared with the stage) of the scanned beam. A MEAN DELAY 1006 is added to the OPF signal to produce a STAGE SYNCH signal 1003 which is coincident with the FACET DETECT signal 1004 when it is present. The STAGE SYNCH signal 1003 is used to strobe the stage position as measured by the laser inferometer system. This information is used to control the stage position and as input to the steering mirror and scan timing correction systems. The OPF signal 1002 is also used to generate a LASER ENABLE signal which turns on beam 1 of the brush for facet defect at the beginning of each scan during printing and calibration.

Thus, an improved laser pattern generation apparatus is described.

We claim:

1. An apparatus for generating a pattern on a workpiece which includes a film responsive to radiant energy comprising:
   a) a laser for providing a radiant energy beam;
   b) beam steering means for aligning said radiant energy beam;
   c) a beam splitting means for splitting said radiant energy beam into a plurality of beams organized into a first set of beams and a second set of beams, said first set of beams separated from said second set of beams by a distance greater than one and less than two times a distance between individual beams;
   d) a modulation means for varying the intensity of each of said plurality of beams responsive to signals defining said pattern;
   e) a rotating mirror having a plurality of facets for causing said plurality of beams to scan said workpiece;
   f) a timing means for timing the provision of signals to said modulation means; and
   g) a stage for holding and moving said workpiece.

2. An apparatus for generating a pattern on a workpiece which includes a film responsive to radiant energy comprising:
   a) a laser for providing a radiant energy beam;
   b) beam steering means for aligning said radiant energy beam, said beam steering means including a plurality of optical steering means for effecting alignment of said beam, splitting means for generating an angle alignment beam and a position alignment beam, and a first detector for detecting alignment in angle and a second detector for detecting alignment position;
   c) a beam splitting means for splitting said radiant energy beam into a plurality of beams organized into a first set of beams and a second set of beams, said first set of beams separated from said second set of beams by a distance greater than the distance between individual beams;
   d) a modulation means for varying the intensity of each of said plurality of beams responsive to signals defining said pattern;
   e) a rotating mirror having a plurality of facets for causing said plurality of beams to scan said workpiece;
   f) a timing means for timing the provision of signals to said modulation means; and
   g) a stage for holding and moving said workpiece.

3. The apparatus as recited in claim 2 wherein each of said plurality of optical steering means is a steering mirror.

4. The apparatus as recited in claim 1 is further comprised of facet detection means for generating synchronization information for said rotating mirror and said stage, said facet detection means apart from said optical path.

5. The apparatus as recited in claim 4 wherein said facet detection means is comprised of:
   a) a laser for generating a radiant energy beam directed towards said facets of said rotating mirror;
   b) a photo detector to detect an occurrence of a reflection of said radiant energy beam off of said facet; and
   c) means for generating a signal corresponding to the occurrence of a reflection of said radiant energy beam off of said facet.

6. The apparatus as recited in claim 1 wherein said modulation means is further comprised of means for providing at least 17 different intensity levels for said beams.

7. The apparatus as recited in claim 1 wherein said timing means is further comprised of means for delaying signals for each of said plurality of beams by a predetermined period.

8. A method for generating patterns on a workpiece which includes a film responsive to radiant energy comprising the steps of:
   a) generating a radiant energy beam;
   b) splitting said radiant energy beam into a plurality of N beams, where N is a whole number greater than 2, said plurality of N beams split into a first set of beams and a second set of beams, said first set of beams separated from said second set of beams by a distance along a first axis is greater than one and less than two times said distance along said first axis between individual beams;
   c) modulating each of said beams to one of a plurality of intensity levels;
   d) scanning said plurality of beams into said workpiece to print a scanline:
   e) repeating steps c) -d) until a stripe is printed; and
   f) printing stripes until the pattern is printed on the wafer.

9. The method for generating patterns on a workpiece as recited in claim 8 wherein said step of modulating each of said beams to one of a plurality of intensity levels is further comprised of the steps of:
   a) receiving pixel values for first and second sets of beams on a first pass, each of said pixel values corresponding to one of said plurality of beams, said pixels in said first and second set of beams positioned according to a normal pixel grid; and
   b) receiving pixel values for a first and second set of beams on a second pass, each of said pixel values corresponding to one of said plurality of beams, said pixels in said second pass positioned according to an interstitial pixel grid.

10. The method for generating patterns on a workpiece as recited in claim 9 wherein said plurality of N beams are displaced at a predetermined angle from a scan axis.

11. The method for generating patterns on a workpiece as recited in claim 10 wherein said step of scanning said plurality of beams onto said workpiece is further comprised of the step of delaying the provision of consecutive beams by a value corresponding to beam position.

12. The method for generating patterns on a workpiece as recited in claim 11 wherein said predetermined angle is 18.434 degrees.

13. The method for generating patterns on a workpiece as recited in claim 12 wherein N=32.

14. The method for generating patterns on a workpiece as recited in claim 10 wherein said step of scanning said plurality of beams onto said workpiece is comprised of the step of offsetting a position of alternate beams of said plurality of beams.

15. The method for generating patterns on a workpiece as recited in claim 10 wherein said plurality of intensity levels is 0 to 16 gray scale levels.

16. In a pattern generation system utilizing a laser for exposing portions of a work piece having a film responsive to radiant energy, a beam steering apparatus for precise alignment and control of a radiant energy beam generated by said laser, said beam steering apparatus comprised of:
   a) a first means for deflecting said radiant energy beam at a first point in space;
   b) a second means for deflecting said radiant energy beam at a second point in space;
   c) a position detection means for detecting the position of said radiant energy beam in said first point in space and said second point in space, said position detection means coupled to said first means for deflecting radiant energy and said second means for deflecting radiant energy.

17. The beam steering apparatus as recited in claim 16 wherein said first means for deflecting said radiant energy beam is a steering mirror and said second means for deflecting said radiant energy beam is a steering mirror.

18. The beam steering apparatus as recited in claim 17 wherein said position detection mean, is further comprised of:
   a) a first beam splitting means for creating an alignment beam from said radiant energy beam;
   b) a second beam splitting means for creating a first positional beam and a second positional beam from said alignment beam; and
   c) a first sensor to detect the position of said radiant energy beam at said first point in space from said first positional beam; and
   d) a second sensor to detect the position of said radiant energy beam at said second point in space from said second positional beam.

19. A method of generating patterns on a workpiece having a film responsive to radiant energy, said method comprising the steps of:
   a) generating a plurality of radiant energy beams;
   b) providing intensity values for each of said plurality of beams for a first scan;
   c) printing said first scan so that each of said plurality of beams is offset from an adjacent beam;
   d) providing intensity values for each of said plurality of beams for a second scan;
   e) printing said second scan butting said first scan so that each of said plurality of beams has the alternate offset from said plurality of beams from said first pass.

20. A method of generating patterns on a workpiece having a film responsive to radiant energy, said method comprising the steps of:
   a) generating a plurality of radiant energy beams;
   b) generating first pixel values for a first pass according to a normal pixel grid;
   c) generating second pixel values for a second pass according to an interstitial pixel grid, said interstitial pixel grid offset from said normal pixel grid;
   d) scanning said plurality of radiant energy beams onto said workpiece according to said first pixel values; and
   e) scanning said plurality of radiant energy beams onto said workpiece according to said second pixel values.

21. An apparatus comprising:
   a laser having a radiant energy beam output;
   a beam steering device having an input optically coupled to said laser, said beam steering device having an aligned radiant energy beam output;
   a beam splitter having an input optically coupled to said beam steering device, said beam splitter having an a plurality of beam sets output, a plurality of beam sets including a first beam set and a second beam set, said first beam set including a first beam and a second beam, said first beam being separated from said second beam by a first distance along a first axis, said first beam set being separated from said second beam set by a second distance along said first axis, said second distance being greater than said first distance to allow for error averaging in successive passes;
   a modulator having an input optically coupled to said beam splitter, said modulator having a modulated beams output, said modulator having a modulating signal input, said modulated beams corresponding to individually modulated beams from said plurality of beam sets;
   a rotating minor, being optically coupled to said modulator, having a plurality of facets that direct modulated beams;
   a timing device, being optically coupled to said rotating mirror, having an timing output being coupled to said modulating signal input; and
   a workpiece stage being optically coupled to said rotating mirror.

22. The apparatus of claim 21 wherein said first distance corresponds to twice a pixel width and said second distance corresponds to three times said pixel width.

23. The apparatus of claim 21 wherein said first axis is a stripe axis.

24. The apparatus as recited in claim 21 wherein said beam steering device is further comprised of:
   a plurality of optical steering devices being optically coupled to said input of said beam steering device;
   a second splitter, being optically coupled to said plurality of optical steering devices, having an angle alignment output and a position alignment output;
   an angle alignment detector being optically coupled to said second splitter; and
   an position alignment detector being optically coupled to said second splitter.

25. The apparatus as recited in claim 24 wherein each of said plurality of optical steering devices is a steering mirror.

26. The apparatus as recited in claim 21 further having a facet detection device, said facet detection device for detecting said plurality of facets of said rotating mirror independent from said modulated beams.

27. The apparatus as recited in claim 26 wherein said facet detection device includes:
   a second laser having a second radiant energy beam output being directed towards said plurality of facets of said rotating mirror;
   a photo detector being optically coupled to said rotating mirror, said photo detector having a detect reflection input directed to receive said second radiant energy beam from said plurality of facets; and
   a signal generator being coupled to said photo detector for generating a signal corresponding to an occurrence of a reflection of said second radiant energy beam from said facet.

28. The apparatus as recited in claim 21 wherein said timing device is for delaying timing signals corresponding to each beam in said beam sets by a predetermined period.

* * * * *